United States Patent [19]

Connolly, Jr. et al.

[11]  4,198,622
[45]  Apr. 15, 1980

[54] DOUBLE DIGITAL-TO-ANALOG CONVERTER

[75] Inventors: Joseph J. Connolly, Jr.; Thomas M. Fredericksen; Thomas P. Redfern, all of San Jose, Calif.

[73] Assignee: National Semiconductor Corporation, Santa Clara, Calif.

[21] Appl. No.: 968,329

[22] Filed: Dec. 11, 1978

Related U.S. Application Data

[63] Continuation-in-part of Ser. No. 879,646, Feb. 21, 1978, abandoned.

[51] Int. Cl.² .............................................. H03K 13/02
[52] U.S. Cl. ...................... 340/347 DA; 340/347 AD
[58] Field of Search .... 340/347 M, 347 DA, 347 AD

[56] References Cited

U.S. PATENT DOCUMENTS 3,183,360   5/1965   Van Santen ................ 340/347 DA Primary Examiner—Charles D. Miller
Attorney, Agent, or Firm—James A. Sheridan; Gail W. Woodward

[57] ABSTRACT

Two digital-to-analog converters are coupled in series across a reference potential source. Each converter includes a resistor ladder and switching tree that permits coupling the output to any single tap on the ladder. A digital word is split into two portions, each one of which operates one switching tree. The converters are weighted in accordance with the word bits applied. The switching tree outputs are combined to produce an analog output related to the reference potential and the digital word.

10 Claims, 10 Drawing Figures

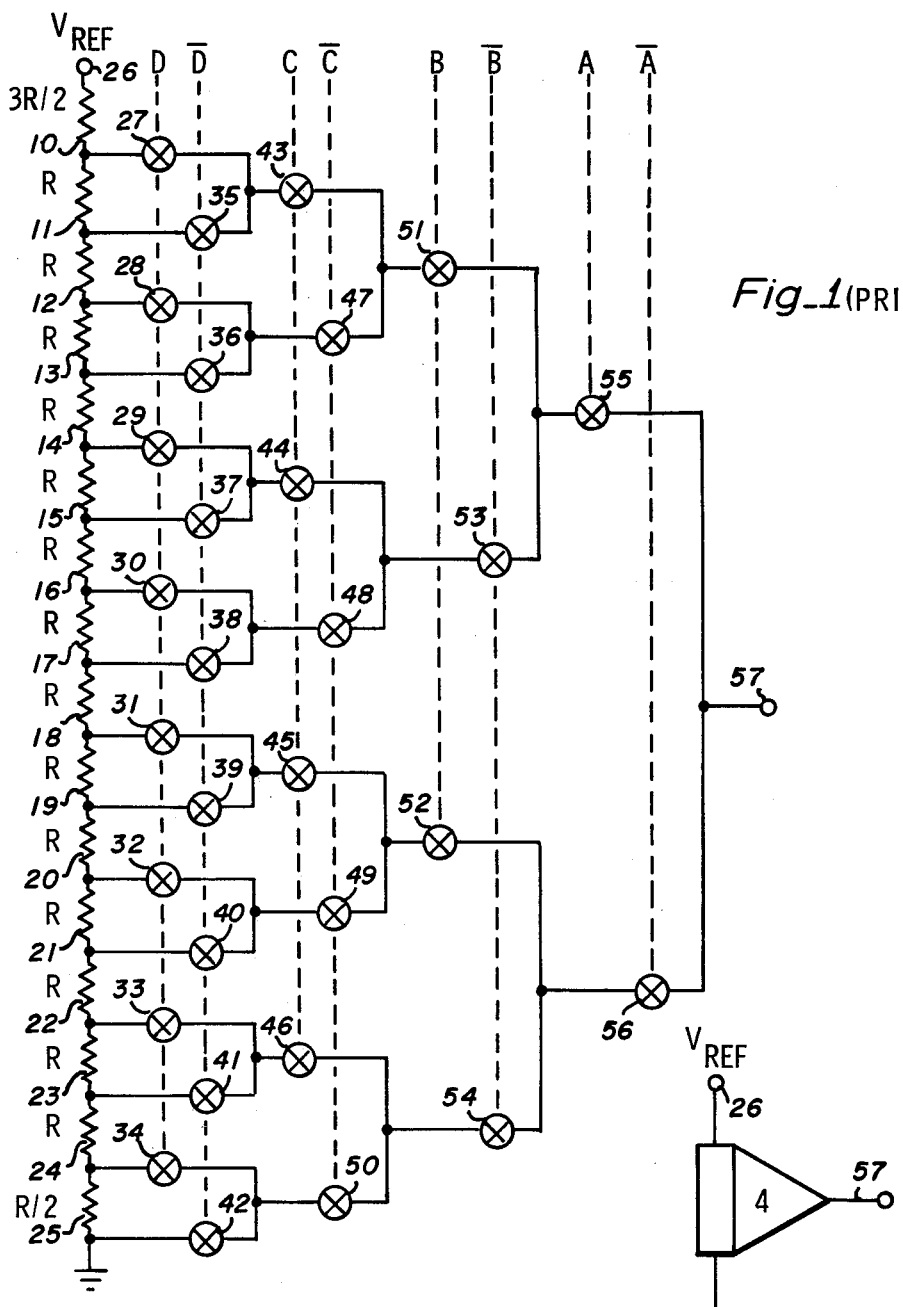
*Fig_1* (PRIOR ART)
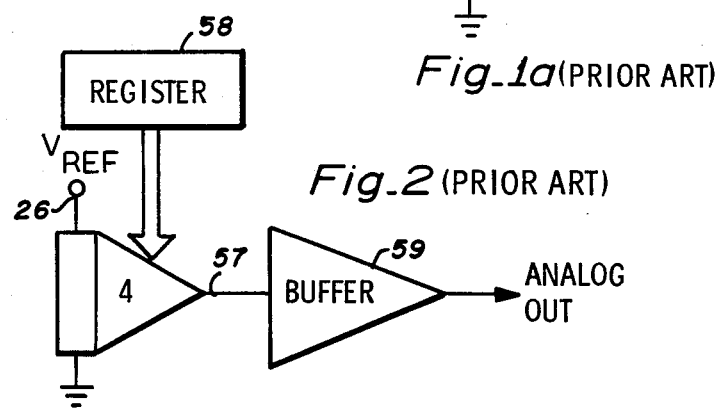
*Fig_1a* (PRIOR ART)
*Fig_2* (PRIOR ART)

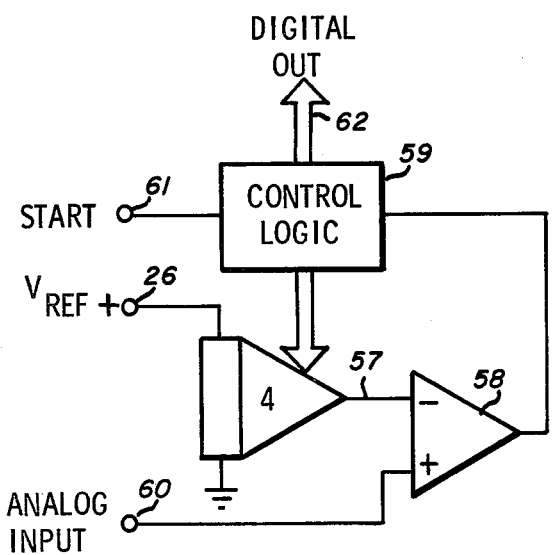
Fig_3 (PRIOR ART)
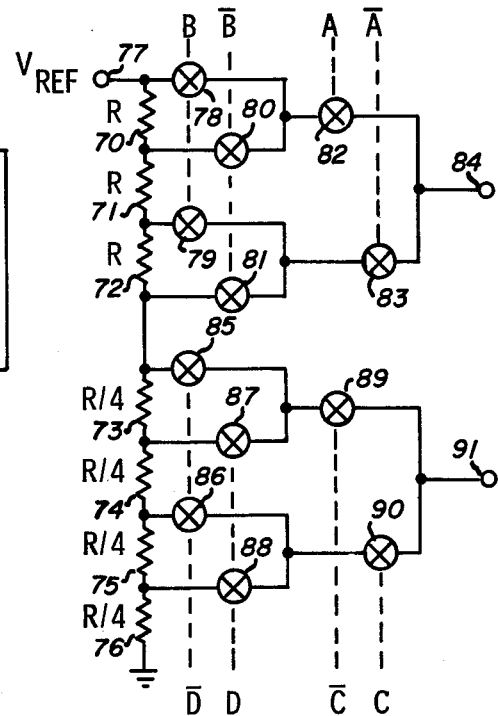
Fig_4
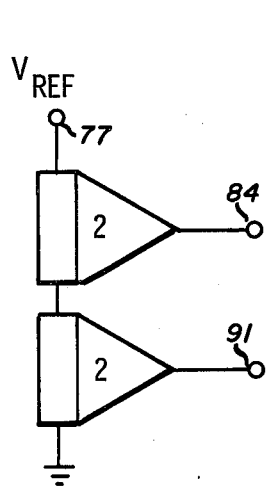
Fig_4a
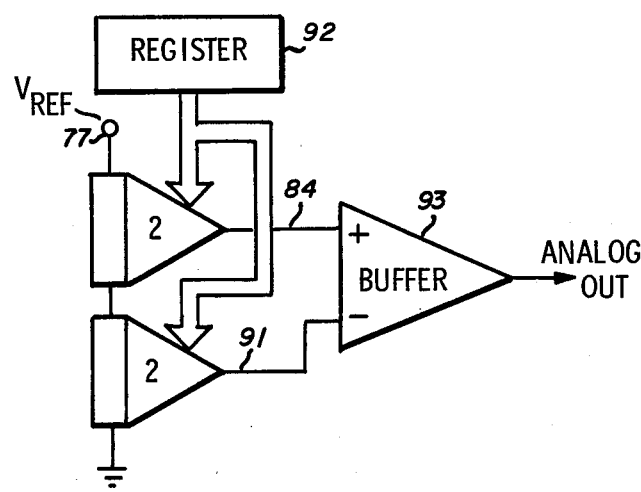
Fig_5

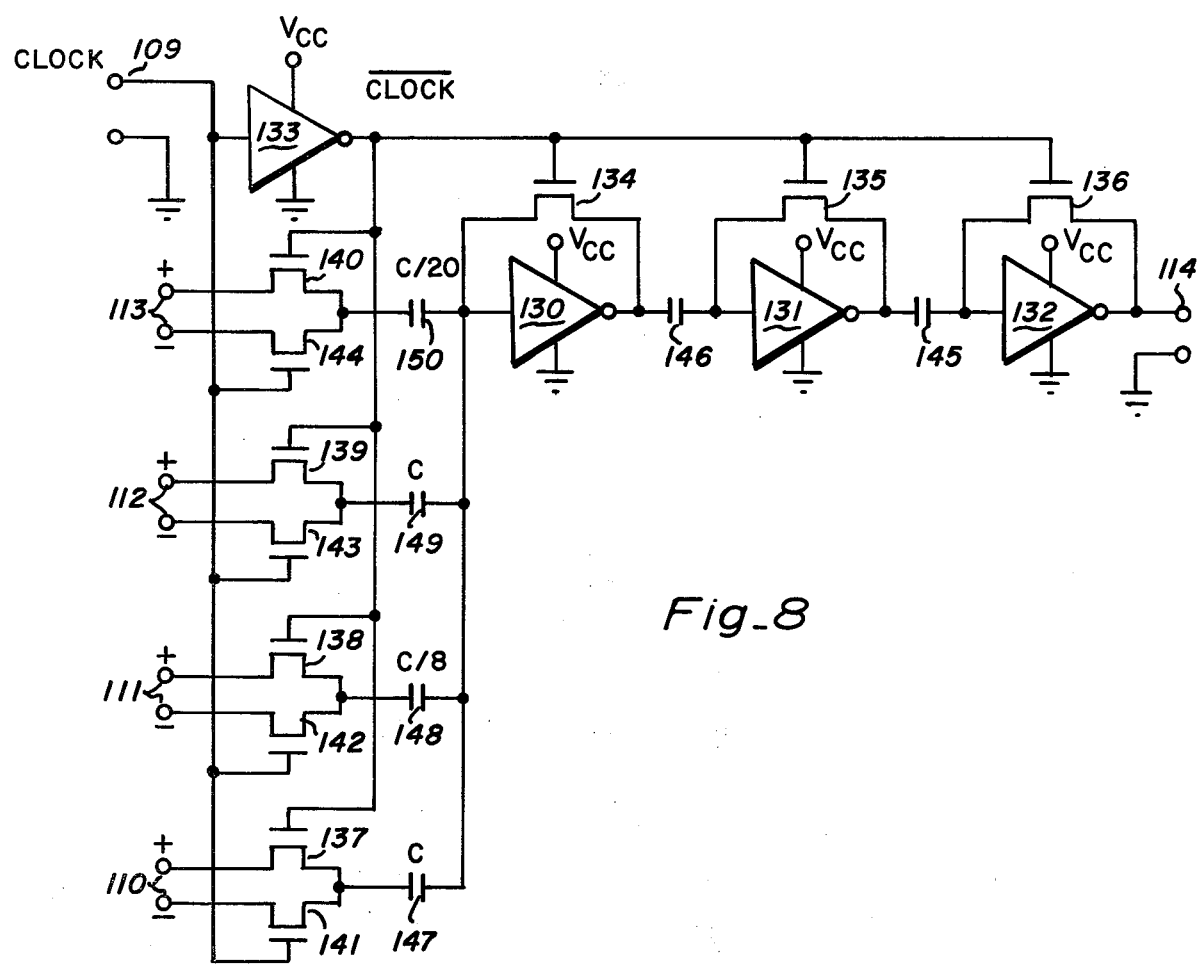
Fig_8

DOUBLE DIGITAL-TO-ANALOG CONVERTER

This application is a continuation in part of application Ser. No. 879,646 filed Feb. 21, 1978 now abandoned.

BACKGROUND OF THE INVENTION

The basic digital-to-analog converter (DAC) is disclosed in copending patent application Ser. No. 777,235 which was filed Mar. 11, 1977, by Adib R. Hamade and Sam S. Ochi, is now abandoned, and is a continuation of application Ser. No. 608,873 filed Aug. 29, 1975, which is now abandoned. A resistor ladder and associated switching tree are shown for digital-to-analog (D/A) and analog-to-digital (A/D) conversion applications. An MOS implementation is also disclosed.

The resistor ladder and switching tree form of DAC has proven to be very useful and amenable to integrated circuit (IC) fabrication using modern large scale integration (LSI) techniques. The resistor ladders have been fabricated in the form of diffused resistors, ion implanted resistors and deposited metal film resistors. The switches in the switching tree can be PMOS or NMOS switches or in the form of CMOS transmission gates. Single-chip, 8-bit, A/D converters using the successive approximation register (SAR) approach have become commercially available at low cost.

The main problem in 8-bit and higher devices is in the large number of resistors and switches that must be used and consequently, the large area required in LSI chips. Not only does the large parts count increase chip size it also reduces fabrication yield and reliability.

SUMMARY OF THE INVENTION

It is an object of the invention to reduce the parts count and size of DACs.

It is a further object of the invention to increase the accuracy of DACs so that they can be manufactured without individual trimming.

These and other objects are realized by using the folowing technique. A double digital-to-analog converter (D-DAC) is created by combining two DACs, each one of which is made up of a resistor ladder and a switching tree. A reference potential is coupled to the two resistor ladders in series. The digital word is divided into two parts which are coupled separately to the switching trees. The greatest parts economy is achieved when the two DACs have the same bit capability and when the digital word has an even number of bits divided equally between the two DACs. The DAC receiving the least significant buts is weighted to equal a single bit in the DAC receiving the most significant bits. In the preferred embodiment one DAC is operated in an inverted mode with respect to the other DAC and the switching tree outputs are combined subtractively. The D-DAC output is equivalent to the prior art device but with greatly reduced parts count.

The D-DAC can be used in a dual configuration. Here each resistor ladder is coupled to two separate switching trees thus permitting the application of two unrelated digital words. Thus, a single dual D-DAC can be used to simultaneously convert two digital words to analog outputs.

BRIEF DESCRIPTION OF THE DRAWING

FIG. 1 is a schematic diagram of a prior art resistor ladder and switching tree for a 4-bit DAC;

FIG. 1a is the symbol for the device of FIG. 1;

FIG. 2 is a block diagram showing the DAC of FIG. 1 in a complete system;

FIG. 3 is a block diagram showing the DAC of FIG. 1 in an A/D system;

FIG. 4 is a schematic of a D-DAC;

FIG. 4a is a symbol proposed for the device of FIG. 4;

FIG. 5 is a block diagram of a D-DAC system;

FIG. 8 is a schematic diagram of a comparator having four input pairs.

DESCRIPTION OF THE PRIOR ART

Figure 6:
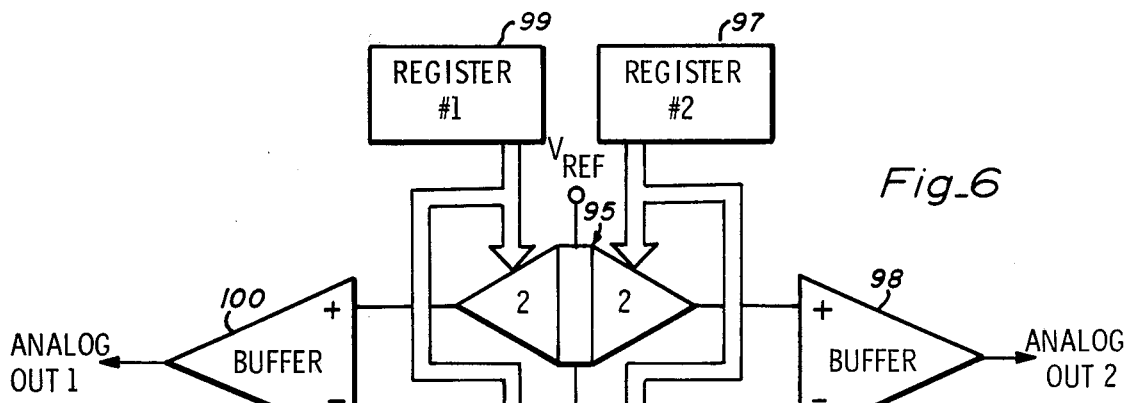
FIG. 6 is a block diagram of a dual D-DAC.

FIG. 1 is a schematic diagram of a prior art DAC having 4-bit capability. Sixteen resistors 10–25 are coupled between terminal 26 ($V_{REF}$) and ground. Resistors 11–24 all have the same value R. Resistor 25 is R/2 and resistor 10 has a value of 3R/2 thus giving the ladder a value of 16R.

A switching tree, composed of 30 switches 27–56, is arranged to couple any of the resistor ladder taps to output terminal 57. The 4-bit digital word (ABCD) has the least significant bit (D) coupled to switches 27–34 and its complement ($\overline{D}$) coupled to switches 35–42. The next to the least significant bit (C) is coupled to switches 43–46 and its complement ($\overline{C}$) coupled to switches 47–50. The most significant bit (A) operates switch 55 and its complement ($\overline{A}$) switch 56. The next to the most significant bit (B) operates switches 51 and 52 and its complement ($\overline{B}$) switches 53 and 54.

In the following discussions it will be assumed that when a bit is applied as a digital one to a switch, the switch will be turned on. The complement of a digital one will turn the switch off.

For the switching tree of FIG. 1 the word ABCD will couple output terminal 57 to the uppermost resistor tap. The word $\overline{ABCD}$ will couple output terminal 57 to ground. If a 16-volt $V_{REF}$ is applied, the word $\overline{ABCD}$ would yield a 0.5 volt output, and the word $\overline{ABC}D$ 1.5 volts, $\overline{AB}CD$ 2.5. This sequence would repeat at a 1-volt increment through ABCD which would yield 14.5 volts. Thus, each digital word is represented by a different output potential.

In FIG. 2, the DAC of FIG. 1 is shown in a system. The DAC is supplied with digital words from register 58, which comprises the digital input. Output terminal 57 is coupled to a buffer 59 which provides the analog output function. The buffer is used to avoid loading the DAC. Since essentially only capacitive charging current flows in the switching tree (switches 27–56), the size of the switches is a factor in the response time of the comparator.

FIG. 3 shows the DAC of FIG. 1 in an A/D configuration. DAC output 57 is coupled to the inverting input of comparator 58 which also acts as a buffer. The digital input is supplied from a control logic 59. The non-inverting input of comparator 58 is coupled to a source of analog voltage input at terminal 60. When a start signal is applied at terminal 61 control logic 59 will step through a digital word sequence until the word most closely approximating the analog input is achieved. The stepping is stopped on this word which then comprises the digital output at 62.

In one stepping sequence often used, the first word applied is $\overline{ABCD}$ which coupled to the tap between resistors 17 and 18 of FIG. 1. (The 7.5 volt tap). If the comparator 58 output is high, the analog voltage is greater than 7.5. Then word $AB\overline{CD}$ is applied. If the comparator out put is still high, the word $ABC\overline{D}$ applied. Thus, a high comparator output steps the word up. A low output would step the word down. This program goes by halves until the nearest resistor tap is found.

The apparatus and a more detailed teaching of the above are available in application Ser. No. 777,235 filed Mar. 11, 1977, and now abandoned, which is incorporated herein by reference.

DESCRIPTION OF THE INVENTION

The D-DAC of the invention is illustrated in FIG. 4 which shows seven resistors 70–76 coupled between $V_{REF}$ at terminal 77 and ground. The upper portion employs resistors 70–72 which comprise a resistor ladder for a 2-bit DAC which uses switches 78–83 in a switching tree configuration to terminal 84.

The lower portion employs resistors 73–76 which comprise a second resistor ladder for a second 2-bit DAC which uses switches 85–90 in a switching tree configuration to terminal 91.

The upper switching tree is provided with the two most significant bits (AB) of a 4-bit digital word. The two least significant bits (CD) of the word are applied to the lower switching tree as shown. The lower resistor ladder is scaled to provide a one bit weighting with respect to the upper ladder. Since both DACs have two bits, the lower four resistors have a value of R/4. The least significant word bit (D) is applied to switches 87–88 and its complement ($\overline{D}$) to switches 85–86. The next to the least significant word bit (C) is applied to switch 90 and its complement ($\overline{C}$) to switch 89. The most significant word bit (A) is applied to switch 82 and its complement ($\overline{A}$) to switch 83. The next to the most significant word bit (B) is applied to switches 78–79 and its complement ($\overline{B}$) to switches 80–81.

FIG. 4a is a symbol proposed for the D-DAC of FIG. 4. FIG. 5 shows a D/A converter using the FIG. 4 D-DAC. Here a register 92 supplies a 4-bit digital word to the D-DAC (2-bits to each section). Outputs 84 and 90, respectively, are coupled to the non-inverting and inverting inputs of buffer 93. Thus, the signal on line 91 is subtracted from the signal on line 84. The critical reason for this combination is that the lower DAC of FIG. 4 is inverted with respect to the upper DAC.

The following table shows the conditions of FIG. 5. The same switch convention described for FIG. 1 will be used. For convenience of the numbers a 4-volts $V_{REF}$ is used. The various output conditions are shown for the various bit combinations of the 4-bit digital word.

TABLE I

| WORD | VOLTAGE AT 84 | VOLTAGE AT 91 | ANALOG OUT |
|---|---|---|---|
| ABCD | 4 | 0.25 | 3.75 |
| ABC$\overline{D}$ | 4 | 0.50 | 3.50 |
| AB$\overline{C}$D | 4 | 0.75 | 3.25 |
| AB$\overline{CD}$ | 4 | 1.00 | 3.00 |
| A$\overline{B}$CD | 3 | 0.25 | 2.75 |
| A$\overline{B}$C$\overline{D}$ | 3 | 0.50 | 2.50 |
| A$\overline{B}\overline{C}$D | 3 | 0.75 | 2.25 |
| A$\overline{BCD}$ | 3 | 1.00 | 2.00 |
| $\overline{A}$BCD | 2 | 0.25 | 1.75 |
| $\overline{A}$BC$\overline{D}$ | 2 | 0.50 | 1.50 |
| $\overline{A}$B$\overline{C}$D | 2 | 0.75 | 1.25 |
| $\overline{A}$B$\overline{CD}$ | 2 | 1.00 | 1.00 |
| $\overline{AB}$CD | 1 | 0.25 | 0.75 |
| $\overline{AB}$C$\overline{D}$ | 1 | 0.50 | 0.50 |
| $\overline{AB}\overline{C}$D | 1 | 0.75 | 0.25 |
| $\overline{ABCD}$ | 1 | 1 | 0 |

The table shows that the output steps from zero to 3.75 volts in quarter volt increments. This overall action is equivalent to that associated with FIG. 1. However, where FIG. 1 uses 16 resistors and 30 switches, the D-DAC of FIG. 4 uses only 7 resistors and 12 switches, less than half the components. Two such D-DACs using 14 resistors and 24 switches will perform an 8-bit function for which the prior art system would require 256 resistors and 510 switches. The problem of providing the ½ LSB shift in all the codes is not shown in FIG. 4 or Table I for clarity of development, but can be handled within the ladder as shown in FIG. 1 or by introducing a fixed ½ LSB shift within the comparator.

While the above described D-DAC used a pair of 2-bit DACs, other configurations are possible with some sacrifice of parts economy. For example, a 3-1, 4-1, 5-2, 5-3 or other combination would be used for 4, 5, 7 and 8 bit words respectively. It is only necessary to allocate the word bits in accordance with the DAC capability and to weight the DAC receiving the LSBs in the proper relationship to the MSB DAC.

While FIG. 4 shows the weighting being accomplished by making resistors 73–76 have a value of R/4, they can be made to have a value of R with a resistor having a value of 4R/3 connected from the juncture of resistors 72 and 73 to ground.

FIG. 6 shows an extension of the D-DAC concept into a DUAL D-DAC. Here a single pair of series connected resistor ladders have two switching trees connected to each one. The right hand portions of DACs 95 and 96 receive a digital word from register 97 and their outputs are coupled to buffer 98. Likewise, the left hand portions of DACs 95 and 96 receive a digital word from register 99 and their outputs are coupled to buffer 100. Each digital word from the two registers will be converted into its analog representation independently. This can be done because the switching trees do not switch current. Therefore, the state of any of the four switching trees does not affect the voltage division in the resistor ladders. Thus, a pair of D-DAC structures can be achieved using only a single resistor ladder and still greater IC parts economy achieved. The two-sided switching tree configuration readily lends itself to IC layout wherein a resistor ladder is flanked on either side by an array of switches.

In theory still more switching trees could be coupled to each resistor ladder to achieve triple and higher D-DAC configurations. However, this creates IC layout problems and switch connection problems that are not easily solved.

While FIG. 6 shows two outputs, the two buffers could be combined to produce a single output. In this case a four-input comparator could be used to accommodate the outputs from the two D-DACs.

Figure 7:
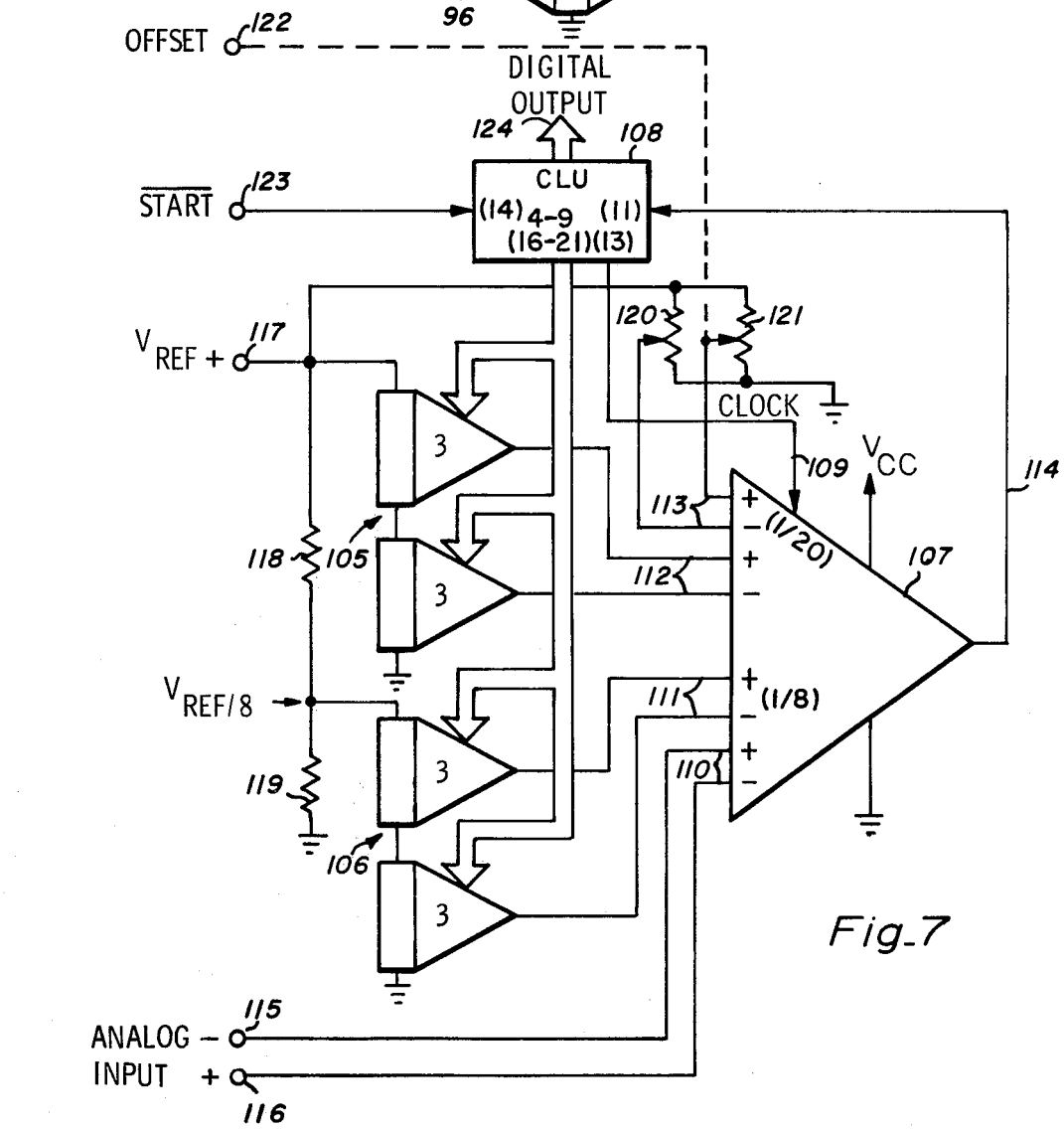
FIG. 7 is a block diagram of a 12-bit A/D converter using two D-DACs, each of which employs two 3-bit DACs.

FIG. 7 shows how the D-DAC concept can be applied to produce a 12-bit A/D converter. Two D-DACs 105 and 106, each having 6-bit capability, are employed and easily implemented. D-DAC 105 is composed of two three-bit sections arranged as an extension of the teaching associated with the device of FIG. 4. The upper section would contain seven resistors and the upper switching tree would include 14 switches operating from three bits. The lower section would include eight resistors of one eighth the value of those in the upper section and 14 switches in the associated tree. The resistor ratio provides the weighting associated with the bit configuration applied to the switching trees. Each D-DAC is coupled, as shown, to an input pair of a plural input comparator 107. Such a device is taught and claimed in our copending application Ser. No. 872,966, filed Jan. 27, 1978, and titled PRECISION PLURAL INPUT VOLTAGE AMPLIFIER AND COMPARATOR.

FIG. 8 shows the elements inside comparator 107 as taught in the above-referenced patent application. Four inverters, 130–133, are employed in conjunction with eleven switches 134–144 and six coupling capacitors 145–150.

When the clock input on line 109 is low, the $\overline{CLOCK}$ will be high and turn on switches 134–140. For this condition switches 141–144 will be off. Switches 134–136 will respectively drive inverters 130–132 to their trip points. The trip point is effectively at the center of the linear range of the inverter. Switches 137–140, respectively, connect capacitors 147–150 to the reference (or +) input terminals. During this clock interval each capacitor will quickly charge to the reference condition. Thus, the reference level sets output line 114 to the trip point of inverter 132.

When the clock input goes high, switches 134–140 will be turned off and switches 141–144 will turn on. Thus, inverters 130–132 are all now active and capacitors 147–150 will each be coupled to the respective inverting inputs. If each inverting input has the same potential as its non-inverting companion, the comparator output will remain at the trip point. If any of the inverting input terminals is more positive than its companion, it will tend to drive the output 114 low. If any of the inverting input terminals is less positive than its companion, it will tend to drive the output 114 high. The output state will be determined by the non-inverting inputs combined with respect to their companions.

If capacitors 147–150 were all of equal value, the four inputs would all have equal effect in determining the output state. However, capacitors 147 and 149 are shown to be equal while capacitor 148 has ⅛ and capacitor 150 has 1/20 of their value. Thus, input 111 will be weighted to have ⅛ of the effect of inputs 110 and 112 while inputs 113 have 1/20 of the effect. This means that the inputs are weighted as shown in the bracketed numbers inside comparator 107 of FIG. 7.

The capacitors inside the comparator are small enough to be fabricated in integrated form in an IC chip and they are large enough to retain a charge over the clock period.

The D-DACs are each supplied with pairs of three bit segments of a 12-bit word generated in control logic unit CLU 108. The functions inside CLU 108 can be achieved with a commercially available device such as an MM54C905, which is identified as a 12-bit successive approximation register. The $\overline{START}$ line is pin 14, which initiates a conversion when low. Clock pulses are available on pin 13. The comparator output couples to pin 11 and the digital word being generated appears on pins 4–9 and 16–21. Pins 19–21 would supply the three most significant bits to the upper half of D-DAC 105 and pins 16–18 would supply the next three most significant bits to the lower half. Pins 4–6 would supply the three least significant bits to the lower half of D-DAC 106 and pins 7–9 would supply the next three significant bits to the upper half. Thus, the twelve bits are distributed equally to the two sections in each of the two D-DACs. The digital output shown at 124 is the twelve bit word available from the MM54C905.

An analog input is coupled to terminals 115 and 116 of comparator 107 in the polarity shown. If desired the analog input can be referenced to ground by applying the correct polarity input to the appropriate input terminal and grounding the other. In addition, while not shown, autopolarity control of comparator 107 can be employed as taught in above-referenced patent application Ser. No. 872,966, filed Jan. 27, 1978. Comparator 107 input lines 110 and 112 are weighted the same whereas input lines 111 are weighted to have a value of ⅛ as shown in the bracket. This is in accordance with the weighting that is used to accommodate the three-bit elements of the D-DACs. The $V_{REF}$ input on line 117 is applied directly to D-DAC 105 and ⅛ of $V_{REF}$ is applied to D-DAC 106 using, for example, a simple resistor voltage divider, resistors 118 and 119.

Comparator input lines 113 are employed for trimming the offset voltage of the complete converter. This input pair is weighted at 1/20 as shown in the brackets. This weighting produces suitable compensation for the value of the least significant bit in D-DAC 106. The trimming is shown as a paor of potentiometers 120 and 121 coupled across $V_{REF}$ in parallel. In practice the potentiometers could be replaced with four fixed-value resistors, one or more of which could be laser trimmed after the circuit is manufactured. This trim would fully compensate the offset voltage of the 12-bit converter.

In addition, if desired, one of the inputs to lines 113 could be brought out to a separate offset terminal 122 as shown by the dashed line. This would permit the user of the A/D converter to correct the offset input voltage when the intended operation of the device requires a change in the reference voltage. One such application, for example, is to operate with an analog input voltage range which does not swing clear to ground nor clear to the max value allowed. For this use, the minimum value of the range can be applied to the (−) analog input 116 and the $V_{REF}$ 117 can be set equal to the span (the difference between the maximum analog input and the minimum analog input). For a large reduction in the magnitude of $V_{REF}$ the offset voltage may have to be readjusted to a value closer to zero.

The operation of the device of FIG. 7 is quite similar to that of FIG. 3. CLU 108, upon receiving a command from start terminal 123 will generate a sequence of 12-bit digital words which will be applied to D-DACs 105 and 106. Each word will be compared in comparator 107 with the analog input at terminals 115–116. The successive words and the logic used to determine the next word in the succession are of conventional prior art design. Once the logic sequence has been completed, the digital word most nearly approximating the analog will be available as output 124.

In terms of the parts economy afforded by the device of FIG. 7, a 6-bit D-DAC (using two 3-bit sections as shown) employs 15 resistors and 28 switches. The 12-bit configuration shown, therefore, employs a total of 30 resistors and 28 switches. A 12-bit DAC using the prior art shown in FIG. 1 requires 4,096 resistors and 8,192 switches.

The invention has been described and its use in D/A and A/D converters detailed. Clearly, a person skilled in the art will, upon reading the above description, recognize alternatives and equivalents. For example, while the preferred comparator 107 is of clocked construction, it could be made up from an assembly of separate conventional comparators having their outputs coupled together and weighted as desired. Accordingly, it is intended that the scope of the invention be limited only by the claims that follow.

We claim:

1. A double digital to analog converter having input terminals for receiving a source of reference potential and for receiving signals representing the bits of a digital word and an analog output for providing an analog potential representative of said digital word, said converter comprising:

a first section coupled to said reference input terminals comprising a first tapped resistor ladder and first decoder means coupled to said taps on said first resistor ladder to provide a first output, means for supplying a first group of bits from said digital word to said first decoder means, said first group of bits including the most significant bit in said word, whereby said first output is coupled, via said first decoder, to one of said taps on said first resistor divider in accordance with the bit content of said first group of bits;

a second section comprising a second tapped resistor ladder coupled in series with said first resistor ladder and second decoder means coupled to said taps on said second resistor ladder to provide a second output, means for supplying a second group of bits from said digital word to said second decoder means, said second group of bits including the least significant bit in said first and second groups of bits, whereby said second output is coupled to one of said taps on said second resistor ladder in accordance with the bit content in said second group of bits, said second resistor ladder having a combined resistance value equal to the value of resistance between adjacent taps on said first resistor ladder and wherein said second resistor ladder forms one resistor element in said first resistor ladder; and means for subtracting said second output from said first output to develop said analog output.

2. The converter of claim 1 wherein said first and second sections each receives the same number of bits in said digital word.

3. The converter of claim 2 in combination with a second converter of like structure and further comprising:

means for dividing said digital word into four groups of bits with the most significant bit group and the next to the most significant bit group being applied respectively to said first and second sections of said converter and the least significant bit group and next to the least significant bit group being applied respectively to the second and first sections of said second converter;

means for applying a fraction of the potential at said reference input terminals to said second converter, said fraction being equal to the ratio of resistors in said first and second resistor ladders; and means for combining said analog output of said converter with said fraction of the analog output of said second converter whereby said combining produces a response that represents the combined word bit response capability of all of said sections.

4. The converter of claim 3 wherein said means for subtracting comprise a differential comparator input and said means for combining comprise a second differential input to a plural input comparator and said fraction represents the weighting of one set of inputs to said plural input comparator.

5. The converter of claim 4 wherein said plural input comparator has an additional differential input having unity weighting with respect to the input responding to said converter and adapted for connection to an analog input potential against which said converter combination is compared.

6. The converter of claim 5 wherein said plural input comparator has an additional differential input and means for applying a controlled offset voltage thereto.

7. A dual double digital to analog converter having input terminals for receiving a reference potential and for receiving digital word bit groups and first and second analog outputs representative of the contents of said digital word bit groups, said converter comprising;

a first section coupled to said reference input terminals and comprising a first tapped resistor ladder and first and second decoder means coupled to said taps on said first resistor ladder to provide first and second outputs, means for supplying first and second digital word bit groups respectively to said first and second decoder means whereby said first and second outputs are independently coupled to a tap on said resistor ladder in accordance with the bit content in said first and second digital word bit respectively;

a second section comprising a second tapped resistor ladder coupled in series with said first resistor ladder and third and fourth decoder means coupled to the taps on said second resistor ladder to provide third and fourth outputs, means for supplying third and fourth digital word bit groups to said third and fourth decoder means whereby said third and fourth outputs are independently coupled to a tap on said second resistor ladder that is determined by the bit content of said third and fourth digital word bit groups respectively, said second resistor ladder having a combined resistance value equal to the value of resistance between adjacent taps on said first resistor ladder and wherein said second resistor ladder forms one resistor element in said first resistor ladder; and means for subtracting said third output from said first output to provide a first analog output releated to the bit content of said first and third digital word bit groups and means for subtracting said fourth output from said second output to provide a second analog output related to the bit content of said second and fourth digital word bit groups.

8. The converter of claim 7 wherein each decoder receives the same number of digital word bits.

9. The converter of claim 8 wherein said means for subtracting comprise the differential input terminals of a comparator.

10. The converter of claim 8 wherein said first and third digital word bit groups represent one digital word and said second and fourth digital word bit groups represent another digital word.

* * * * *